United States Patent
Furukawa et al.

(10) Patent No.: US 6,531,379 B2
(45) Date of Patent: Mar. 11, 2003

(54) HIGH RESOLUTION DOPANT/IMPURITY INCORPORATION IN SEMICONDUCTORS VIA A SCANNED ATOMIC FORCE PROBE

(75) Inventors: Toshiharu Furukawa, Essex Junction, VT (US); John Joseph Ellis-Monaghan, Grand Isle, VT (US); James Albert Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/829,309

(22) Filed: Apr. 9, 2001

(65) Prior Publication Data

US 2001/0021575 A1 Sep. 13, 2001

Related U.S. Application Data

(62) Division of application No. 09/296,368, filed on Apr. 22, 1999, now Pat. No. 6,251,755.

(51) Int. Cl.$^7$ ............................................. H01L 21/22
(52) U.S. Cl. ...................... 438/558; 257/345; 257/402; 257/403; 438/539; 438/518; 438/526; 438/533; 438/537
(58) Field of Search .................................. 257/345, 402, 257/403; 438/539, 518, 526, 533, 537

(56) References Cited

U.S. PATENT DOCUMENTS

| 4,539,089 A | 9/1985 | Binnig et al. |
|---|---|---|
| 4,566,937 A | 1/1986 | Pitts |
| 5,015,323 A | 5/1991 | Gallagher |
| 5,047,649 A | 9/1991 | Hodgson et al. |
| 5,126,574 A | 6/1992 | Gallagher |
| 5,266,502 A | 11/1993 | Okada et al. |
| 5,289,408 A | 2/1994 | Mimura et al. |
| 5,294,465 A | 3/1994 | Gallagher |
| 5,365,073 A | 11/1994 | White |
| 5,416,331 A | 5/1995 | Ichikawa et al. |
| 5,539,203 A | 7/1996 | Ohdomari |
| 5,763,933 A | 6/1998 | White |
| 5,955,745 A | * 9/1999 | Yamazaki ..................... 257/63 |
| 6,147,383 A | * 11/2000 | Kuroda ........................ 257/344 |

FOREIGN PATENT DOCUMENTS

| DE | 280 198 A1 | 6/1990 |
|---|---|---|
| JP | 1-211840 | 8/1989 |
| JP | 1-211848 | 8/1989 |
| WO | WO 94/20991 | 9/1994 |

OTHER PUBLICATIONS

IBM Technical Disclosure Bulletin, vol. 35, No. 1A, pp. 43–44 (Jun. 1992).
IBM Technical Disclosure Bulletin, vol. 35, No. 4A, p. 225 (Sep. 1992).
IMB Technical Disclosure Bulletin, vol. 37, No. 04B, p. 371 (Apr. 1994).
J. A. Dagata, et al., "Modification of Hydrogen–Passivated Silicon by a Scanning Tunneling Microscope Operating in Air," Appl. Phys. Lett., vol. 56, No. 20, pp. 2001–2003 (May 1990).
Ph. Avouris, et al., "Atomic and Nanometer Scale Modification of Materials with the STM," IBM Research Division, Research Report, Materials Science, pp. 1–19.

* cited by examiner

Primary Examiner—Olik Chaudhuri
Assistant Examiner—Wai-Sing Louie
(74) Attorney, Agent, or Firm—Scully, Scott, Murphy & Presser; William D. Sebo, Esq.

(57) ABSTRACT

The present invention employs a scanned atomic force probe to physical incorporate impurity atoms (dopant or bandgap) into a semiconductor substrate so that the impurity atoms have high resolution and improved placement. Specifically, the method of the present invention comprising a step of physically contacting a semiconductor surface having a layer of a dopant/bandgap source material thereon such that upon said physical contact impurity atoms from the dopant/bandgap source material are driven into the semiconductor substrate.

8 Claims, 7 Drawing Sheets

HIGH RESOLUTION DOPANT/IMPURITY INCORPORATION IN SEMICONDUCTORS VIA A SCANNED ATOMIC FORCE PROBE

RELATED APPLICATIONS

This application is a divisional of U.S. application Ser. No. 09/296,368, filed Apr. 22, 1999, now U.S. Pat. No. 6,251,755.

FIELD OF THE INVENTION

The present invention relates to a method of implanting impurity atoms into the surface of a semiconductor substrate using a scanning atomic force probe. The scanning atomic force probe employed in the present invention provides better control, i.e. placement, of the impurity atoms into the substrate and provides higher impurity resolution which cannot be obtained using conventional ion implantation processes. Moreover, the atomic force probe is capable of controlling the drive-in depth of the impurity atoms to near the substrate's surface so that, despite some diffusion during annealing, the activated impurity region (dopant or bandgap) is still close to the surface of the substrate. This permits formation of a shallow, narrow diffusion region within the substrate so that very small devices can be built thereon.

The present invention also provides heterojunction semiconductor devices which contain a tapped-in dopant or bandgap region which is formed laterally in a semiconductor substrate using the method of the present invention.

BACKGROUND OF THE INVENTION

In the field of semiconductor manufacturing, it is well known to use a low energy, low dose ion implantation process to incorporate impurity atoms into a semiconductor substrate. While conventional ion implantation is capable of providing implant regions in most devices, it does not always provide sufficient ion placement, resolution and shallow depths that are typically required even for today's deep-submicron semiconductor devices; and will not be adequate for more aggressively scaled-down devices in the near future.

For example, in the context of silicon VLSI technology, the volume bounded by a sub-0.1 $\mu$m channel length, L, metal oxide semiconductor field effect transistor (MOSFET) having sub-micron gate widths, W, where W is less than 0.10 $\mu$m, and which is doped with at most $1.0 \times 10^{18}$ atoms/cm$^3$ (implying a maximum depletion depth of 0.10 $\mu$m) will contain on the order of 25 to 100 dopant atoms. The percent control, C, of the integrated dose of this threshold implant is roughly proportional to [1-sqt (N)/N], wherein N is the number of dopant atoms in the depletion region. Thus, when N=1000, the percent control, C, is roughly 99%; when N=100, C is equal to 90%; and when N=25, C is about 80%. Clearly, the degree of dose control drops precipitously for very small semiconductor devices.

In view of the current trend towards smaller and smaller semiconductor devices, there is a need for developing new and improved methods for incorporating dopant atoms into semiconductor substrate. Such methods should provide improved controllability as well as resolution while limiting the dopant drive-in depth to within 1 to 3 monolayers from the substrate's surface.

One known alternative to using conventional low energy, low dose ion implantation is to employ a Scanning Tunneling Microscope (STM). In this prior art technique, a voltage is applied between the tip of the microscope and the semiconductor sample. When the tip of the Scanning Tunneling Microscope is brought in close proximity to the semiconductor sample (i.e. gap$\leq$1 nm), ionized atoms accelerate through the gap due to the electric field in the gap and are implanted into the semiconductor sample. While Scanning Tunneling Microscopy might be used in some applications, it may not afford the controllability in dopant placement due to electric field lateral dispersion and dopant drive-in depth required for today's generation of sub-micron semiconductor devices. A bigger problem is the need for high vacuum in which to operate the STM.

SUMMARY OF THE INVENTION

One object of the present invention is to provide a novel method for incorporating impurity atoms, i.e. dopant atoms or bandgap material, into a semiconductor substrate which provides improved placement, percent control and number of impurity atoms within a semiconductor substrate.

Another object of the present invention is to provide a method of incorporating impurity atoms into a semiconductor substrate within a controlled depth that is near the surface of said semiconductor substrate (3 monolayers or less).

A further object of the present invention is to provide a method of incorporating impurity atoms using substantially mechanical means rather than electrical means or conventional ion implantation.

These and other objects and advantages are obtained in the present invention by employing the use of an atomic force probe to drive-in impurity atoms from a dopant/bandgap source material layer into the surface of an underlying semiconductor substrate. Specifically, the method of the present invention comprises the steps of:

(a) providing a semiconductor substrate having a dopant/bandgap source material layer formed on one surface thereof, said dopant/bandgap source material layer having impurity atoms therein; and (b) physically contacting the structure provided in step (a) with an atomic force probe under conditions such that the impurity atoms from the dopant/bandgap source material layer are driven into the semiconductor substrate.

In another aspect of the present invention, heterojunction semiconductor structures are provided.

Specifically the heterojunction semiconductor structures of the present invention comprise:

a semiconductor substrate having at least two doped contact regions formed therein (source/drain or emitter/collector), each of said doped contact regions separating internal active device regions from each other, said internal active device regions comprising tapped-in dopant or bandgap layers which are present laterally in the semiconductor substrate; and external active device regions formed on said semiconductor substrate above said internal active device regions.

It is emphasized that the method of the present invention is employed in forming the tapped-in dopant or bandgap layers. In the case of the dopant layers, the method of the present invention modifies the Fermi level of the junction; whereas when bandgap layers are formed, the method of the present invention alters the valence/conductive bands of the junction without directly modifying the Fermi level.

Figure 2A:
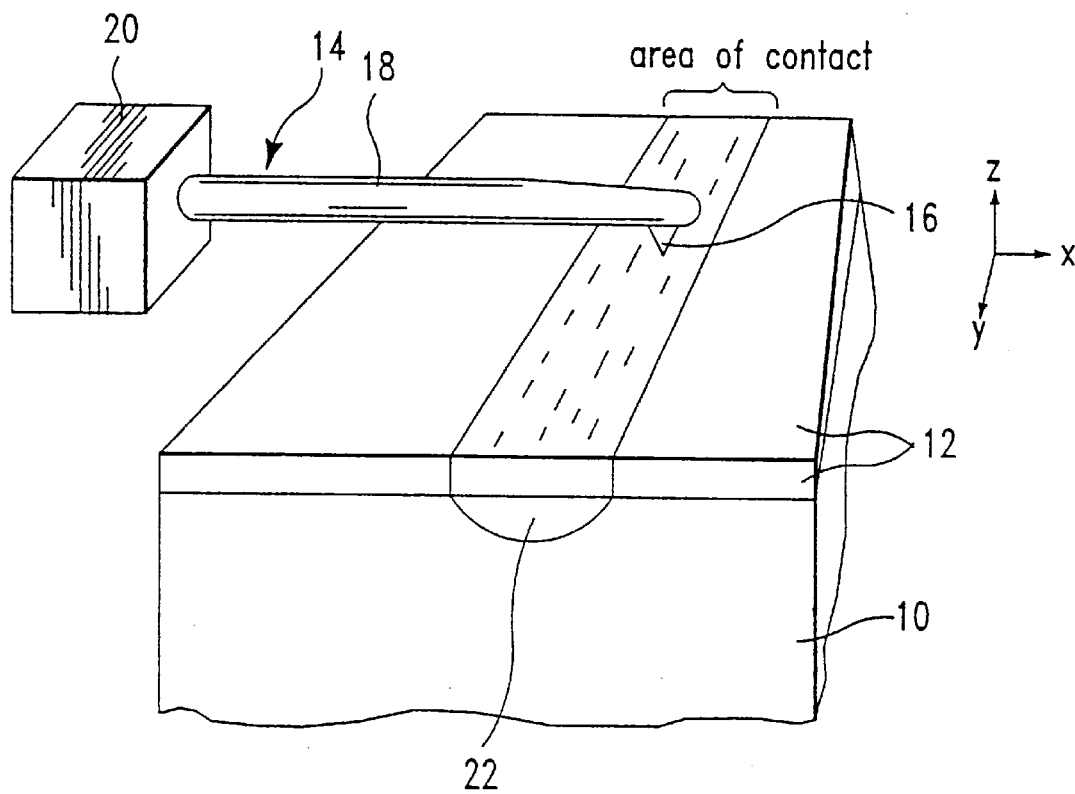
Figure 2B:
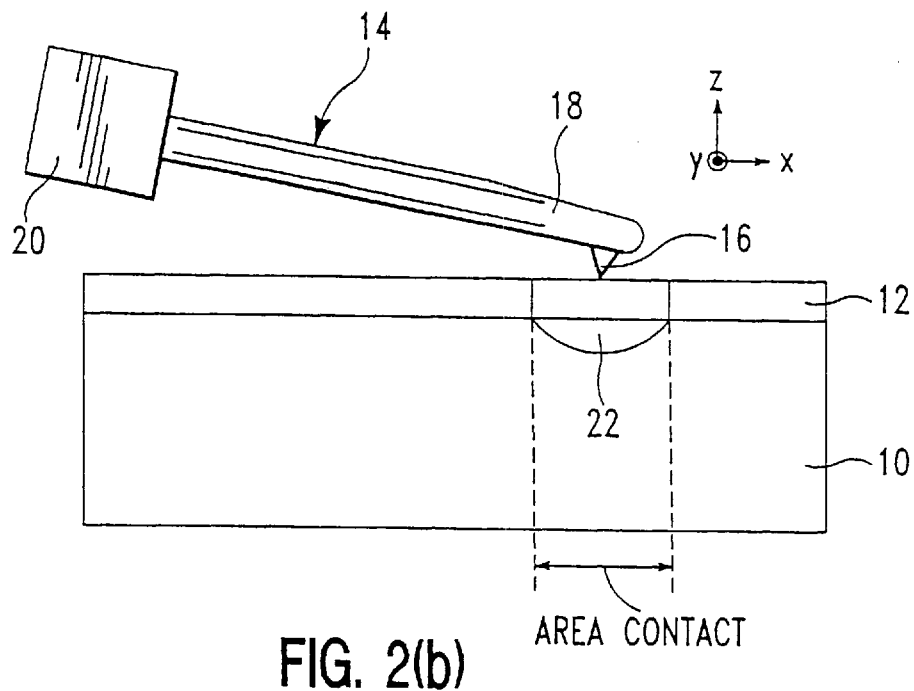

FIGS. 2(a)–(b) show two different perspective views of the contacting step of the present invention.

Figure 1:
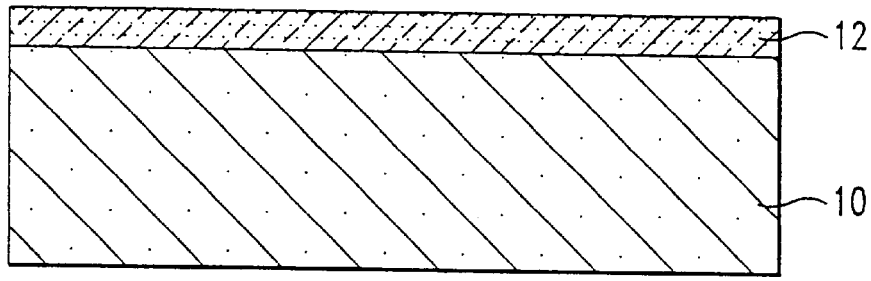
FIG. 1 is a cross-sectional view showing an initial structure comprising a dopant/bandgap source material layer 12 formed on one surface of a semiconductor substrate 10 which can be employed in the present invention.
Figure 3:
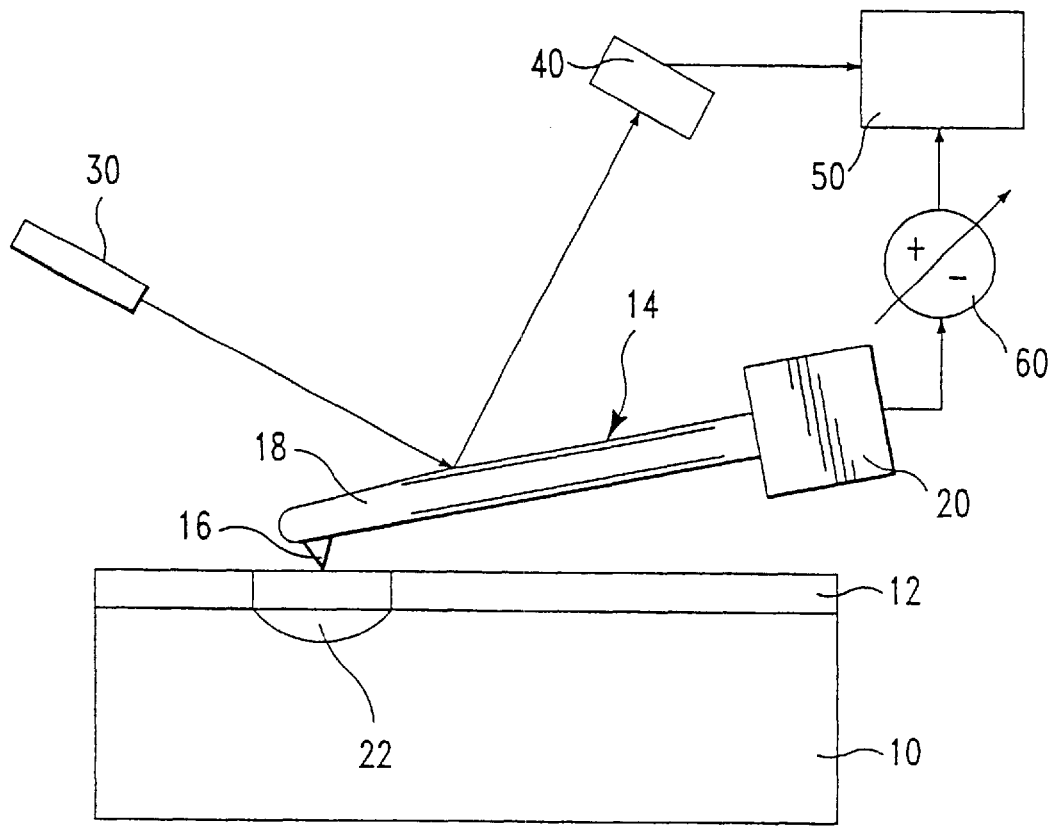

FIG. 3 shows an arrangement used in the present invention for driving in the impurity atoms from the initial structure shown in FIG. 1.

Figure 4A:
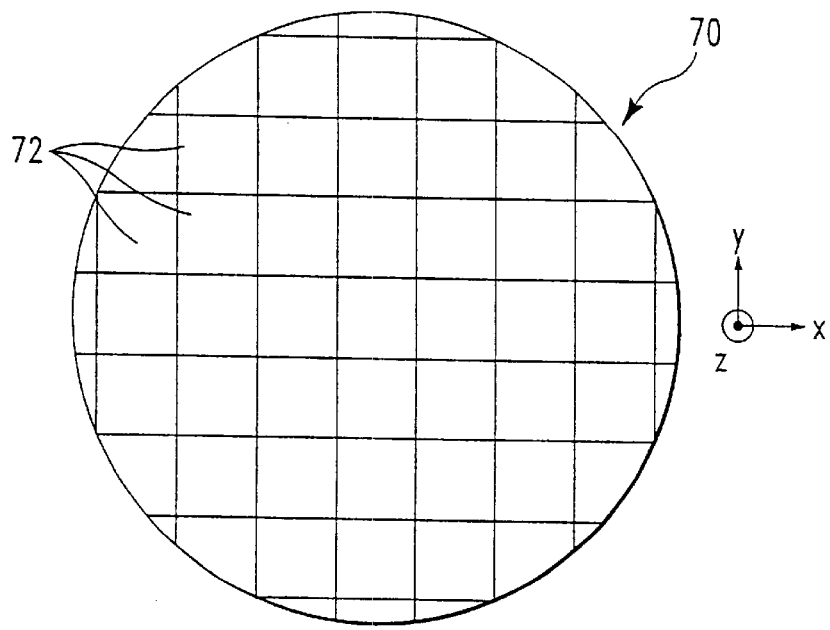
Figure 4B:
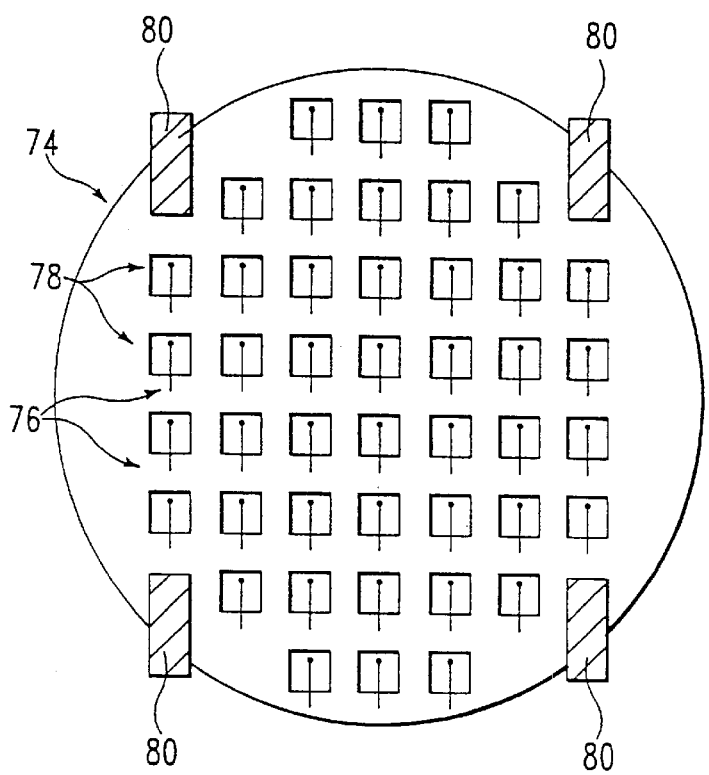
Figure 4C:
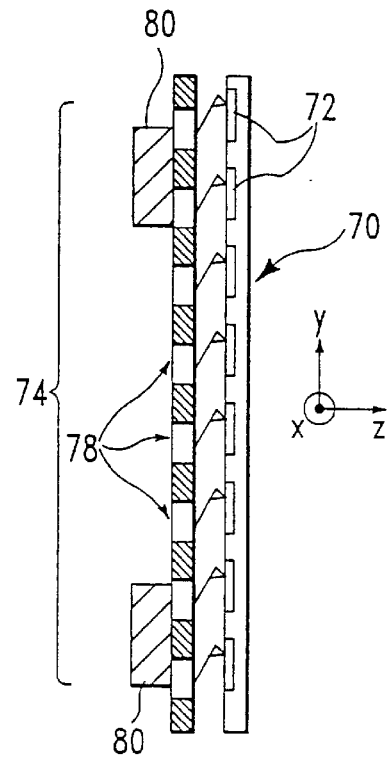

FIGS. 4(a)–(c) show an embodiment of the present invention wherein a multiple tip is employed.

Figure 5:
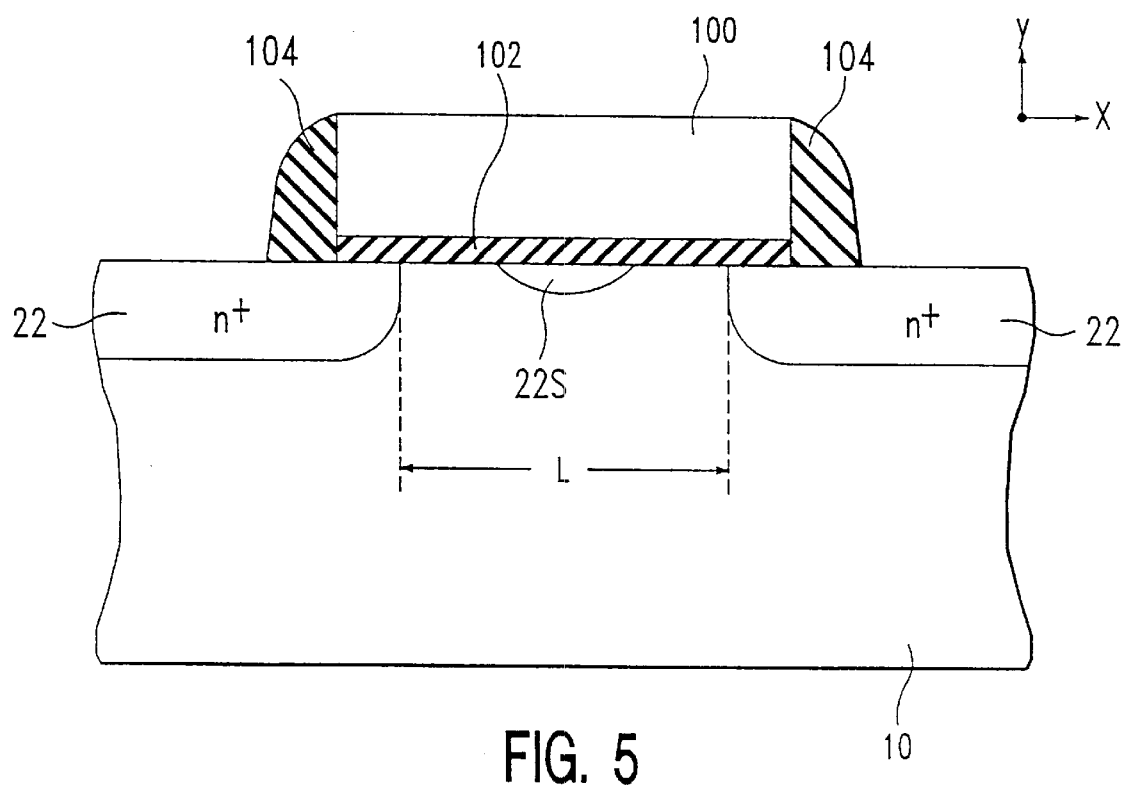

FIG. 5 shows one application of the present invention for providing a n- or p- FET "spotweld." That is, a very localized region of dopant intentionally positioned so as to alter the local electrical conductivity of the substrate in the immediate vicinity of the spot.

Figure 6:
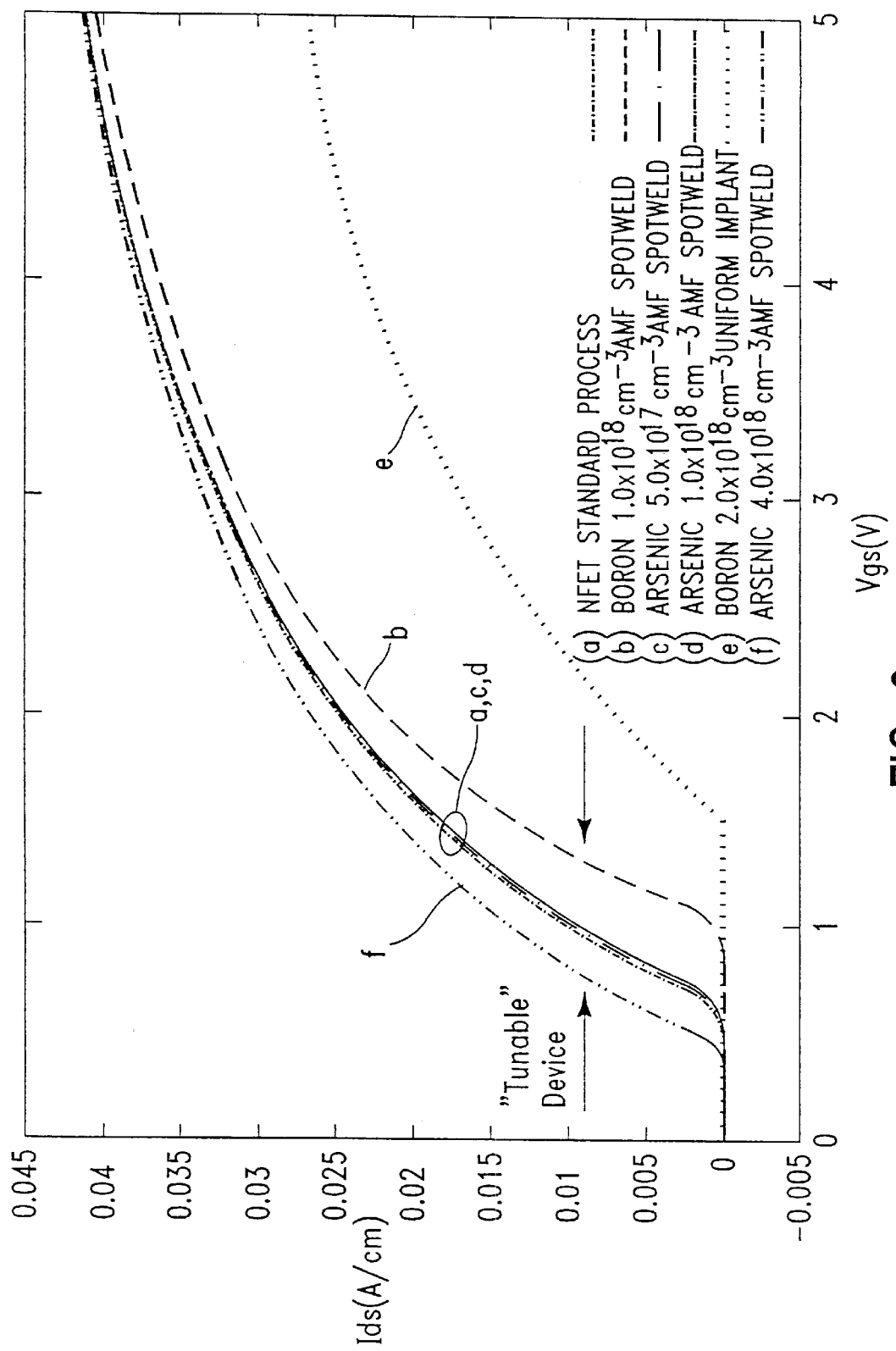

FIG. 6 is a plot of Drain Current, IdVgs, vs. Gate voltage, Vgs, at Vd=0.05 V for various dopant spot-welds.

Figure 7A:
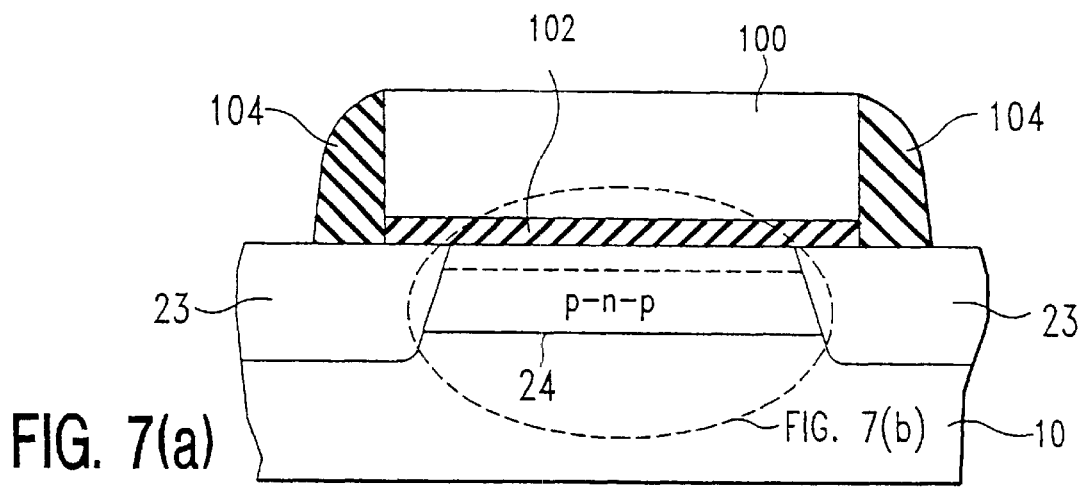

FIGS. 7(a) and (b) are cross-sectional views of a heterojunction semiconductor structure of the present invention having a lateral p-n-p junction formed therein.

Figure 8:
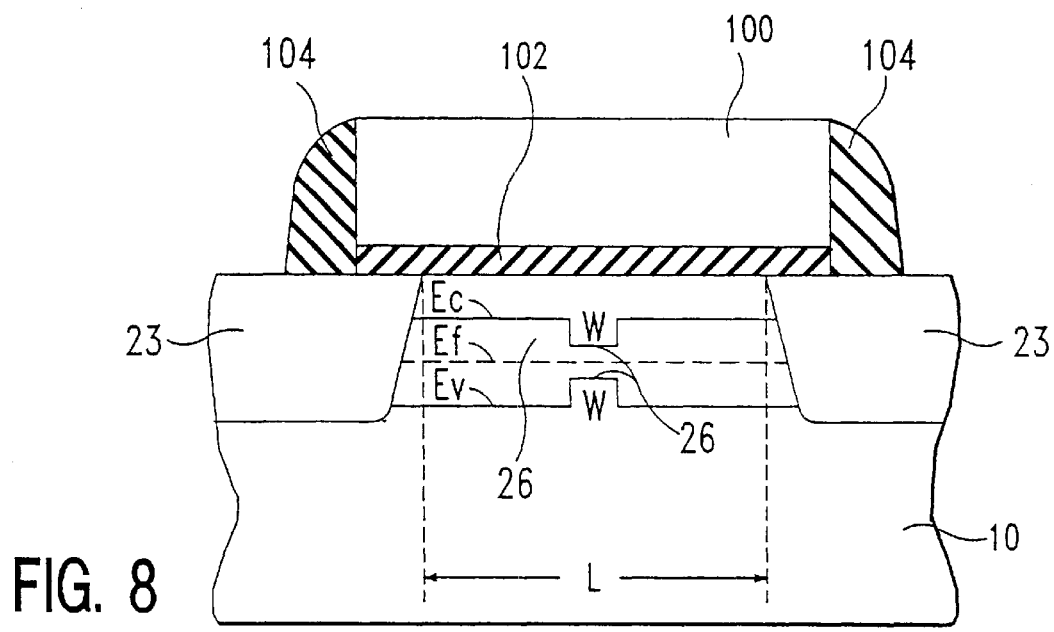

FIG. 8 is a cross-sectional view of a heterojunction semiconductor structure of the present invention having a bandgap region formed therein.

Figure 9:
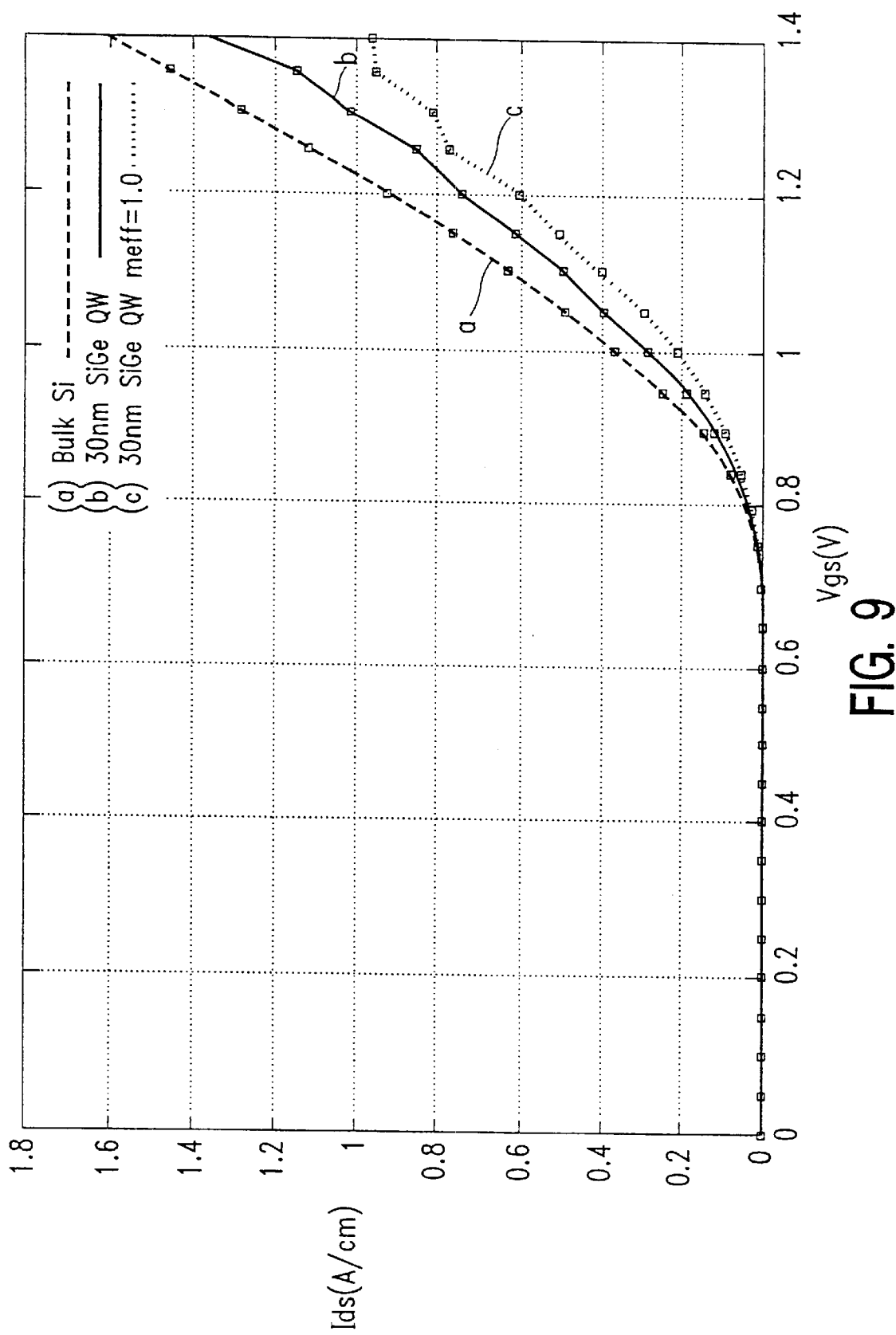

FIG. 9 is a graph of Ids (Amps) vs. Vgs (Volts) for a standard FET and a modulated channel $Si_xGe_{1-x}$ FET heterostructure such as shown in FIG. 8.

DETAILED DESCRIPTION OF THE INVENTION

The present invention, which provides a controllable method for incorporating impurity atoms into a semiconductor substrate, will now be described in greater detail by referring to the drawings that accompany the present application. It is noted that in the accompanying drawings like reference numerals are used for describing like and corresponding elements of the present invention.

Reference is first made to FIG. 1 which shows a cross-sectional view of the initial semiconductor structure that can be employed in the present invention prior to contact with an atomic force probe (or atomic force microscope (AFM)). Specifically, the initial structure shown in FIG. 1 comprises a semiconductor substrate 10 having a layer of dopant or bandgap source material 12 formed on one of its surfaces. This initial structure is fabricated using conventional techniques and materials that are well known to those skilled in the art.

For instance, semiconductor substrate 10 is composed of any semiconducting material including, but not limited to: Si, Ge, SiGe, GaAs, InAs, InP and all other III/V compounds. The semiconductor substrate may contain device isolation regions imbedded in the surface thereof. For simplicity, those regions are not shown in the drawings accompanying the present application.

Dopant or bandgap source material layer 12 employed in the present invention is any material that contains impurity atoms therein which can be driven from the deposited layer into the semiconductor substrate by substantially mechanical means. The term "mechanical means" is used herein to denote that the impurity drive-in occurs by an external physical force that is applied to the dopant or bandgap source material layer.

Suitable dopant source materials for doping a silicon semiconductor which can be used as layer 12 include, but are not limited to: arsenic doped silicate glass (ASG), phosphorus doped silicate glass (PSG) and boron doped silicate glass. It is noted that the atoms As, P and B are driven into the substrate upon contact with the atomic force probe. Furthermore, the dopant atoms employed in the present modifying the Fermi level of the channel. The dopant concentration present in layer 12 is typically of from about $10^{17}$ to about $10^{18}$ atoms/cm$^3$. In some cases, it may be possible to achieve $10^{19}$ atoms/cm$^3$.

Suitable bandgap source materials that can be employed in the present invention are materials which contain impurity atoms that can alter the valence/conductive bands of the channel region without directly modifying the Fermi level of the channel. Suitable impurities include: Ge, Sn and C. The bandgap source material may comprise a layer of said impurities in elemental or oxide form, or in a stoichiometric film (e.g. SiC).

In the case of III/V semiconductor compounds, the possible dopant species are plentiful, (See, for example, H. C. Casey, "Diffusion in the III–V Compound Semiconductors," in Atomic Diffusion in Semiconductors, ed. D. Shaw, Plenum Press, London and New York, 1973, p. 351–430.). In doping GaAs, via the present invention, Zn is the standard acceptor dopant, while Si, Ge, and Sn are standard donor dopants. Overlying dopant film layers of pure Zn or Si from which Zn or Si are to be "tapped" into the underlying GaAs substrate, are easily achievable by those skilled in the art.

Dopant or bandgap source material 12 is applied onto a surface of semiconductor substrate 10 as a thin film by using conventional deposition processes well known to those skilled in the art. For example, the dopant/bandgap source material can be applied to the semiconductor substrate by chemical vapor deposition, plasma-assisted chemical vapor deposition, spin-on coating, dip coating, and other like deposition techniques. The thickness of the applied dopant/bandgap source material layer is at least about 50 Å. Though, in principle, the film can be as thin as 30 Å. Given the current art, the preferred thickness is from about 50 to about 200 Å, which ensures adequate film coverage of the underlying semiconductor to supply the necessary impurity atoms.

The initial structure containing the dopant/bandgap source material layer and semiconductor substrate may, optionally, be subjected to a conventional planarization technique prior to contact with the atomic force probe. This optional embodiment is generally employed when the deposition process used in forming the dopant/bandgap source material layer does not form a conformal layer of the same on the surface of the semiconductor substrate.

In accordance with the next step of the present invention, the initial structure shown in FIG. 1 is then physically contacted with an atomic force probe such that the impurity atoms in the dopant/bandgap source material layer are driven into the semiconductor substrate. This step of the present invention is shown in FIGS. 2(a)–(b). Specifically, FIGS. 2(a)–(b) show two perspective views of an atomic force probe 14 in contact with the surface of the initial structure shown in FIG. 1.

Atomic force probe 14 comprises a tip 16, a cantilever 18 and a cantilever base 20. Region 22 denotes the area in which the impurity atoms are driven into the semiconductor substrate after the mechanical contacting step. The tip of the atomic force probe shown in FIGS. 2(a)–(b) is fabricated via standard very large scale integration (VLSI) mask and etch processes well known to those skilled in the art.

The cantilever base is typically a 1 mm×1 mm square. The length, l, of the cantilever base is typically of from about 100 to about 200 μm and the thickness thereof is from about 2 to about 3 μm. It is noted that these values are not critical to the present invention and may vary depending on the type of probe used. The cantilever itself typically has a spring constant, k, on the order of 20–100 Newton/meter.

The tip of the atomic force probe is generally conically shaped and it is composed of silicon. Other shaped tips are also contemplated in the present invention. The height of the tip may vary depending on the exact probe but generally the height of the tip is from about 5 to about 10 $\mu$m. The apex of the tip is roughly hemispherical with a radius of curvature of from about 5 to about 20 nm. The tip may be a single tip or multiple tips may be employed.

Although silicon is a preferred tip material, the present invention also contemplates that the silicon tip can be coated with a conductive material. Suitable conductive materials for coating the silicon tip include, but are not limited to: titanium nitride (TiN) and titanium silicide (TiSi$_2$). The conductive material is applied as a thin coating having a thickness of from about 2 to about 5 nm. The coated silicon tip provides an optional means for application of an external electrical potential bias to the tip relative to the underlying sample. Hence, it provides an optional embodiment of the present invention wherein both mechanical and electrical means are used for driving in the impurity atoms into the surface of the substrate. The combined mechanical and electrical means provides further positional and depth control to the present process. TiN and TiSi$_2$ coated tips are described in copending and coassigned U.S. patent application, Ser. No. 08/889,643, filed Jul. 8, 1997, the contents of which are being incorporated herein by reference.

The base of the atomic force probe is mounted to a z-piezo-actuator, not shown in FIG. 2, which can drive the cantilever to oscillate "up and down" in the z-direction, i.e. perpendicular to the underlying structure surface plane (x-y). Given the value for k, the cantilever is driven near its resonant frequency, $\omega_o$, which is typically 2 to 400 kHz. This provides maximum response to external forces. The cantilever tip system can be scanned in the x-y plane, parallel to the structure, and in close proximity to it (h less than 3 nm). x-y scans can span up to a 100 $\mu$m×100 $\mu$m square with a precision of 1 nm×1 nm.

As is well known to those familiar with atomic force probes, two types of modes are possible: contact mode and the non-contact mode. In the present invention, the atomic force probe is employed in the contact mode. For background, however, the following description concerning the non-contact mode is given herein.

When the tip is proximate to a sample surface in the range of from about 0.5 to about 3.0 nm, the tip is attracted but not in direct contact to the sample surface by Van der Waals forces (F). This force causes the cantilever to oscillate at a new frequency, $\omega$, not equal to $\omega_o$. The difference in frequency, delta $\omega=\omega-\omega_o$, is sensed by the ensuing deflection of a laser beam which constantly is reflected off the backside of the cantilever. The delta $\omega$ is converted to a feedback voltage, $V_f$, to alter a z-piezo electric actuator state to readjust the cantilever back to its near resonant frequency, $\omega_o$. For every (x,y) in the scan, there is a unique $V_f(x,y)$. A map of the surface topography of the sample can thus be obtained.

In the contact mode, delta $\omega$ correction signal is used to force the tip into direct physical contact with a sample, i.e. the dopant source material layer. Using the contact mode, the tip of the probe is the range of from 0 to about 0.5 nm from the surface of the sample. If the correction force is of sufficient force (>10$^{-8}$ Newtons) the underlying sample can be damaged or pitted or intentionally altered as is preferably desired herein. The tip shape itself can be altered, if a durable film is not present on the tip. Again, a surface map can be obtained. A schematic of the contact mode technique employed in the present invention is shown in FIG. 3. Specifically, FIG. 3 shows an arrangement of an atomic force probe system that can be used in the present invention. Reference numerals 10, 12, 14, 16, 18, 20 and 22 are as defined above. As shown, the arrangement includes a laser 30, a photodetector 40, feedback/control 50 and a z-piezo actuator 60. Elements 30, 40, 50 and 60 work to accurately position the tip of the atomic force probe in the x and y directions.

In accordance with the present invention, the contact mode is capable of driving impurity atoms from the dopant/bandgap source material layer into the semiconductor substrate. The depth in which these impurity atoms can be driven-in is from about 0.5 to about 3.0 nm. More preferably, the depth of the driven in impurity atoms is from about 2.0 to about 3.0 nm. These values illustrate that the method of the present invention provides localized doping in the substrate. The term "localized" means that the impurity concentration is controlled to within 1 nm resolution in the lateral, i.e. the x and y, directions (see FIGS. 2a and 2b), and to within a vertical depth of 0.5 to 3.0 nm .

Such a degree of localized doping is exceedingly difficult to obtain using the prior art ion implantation processes.

To achieve the drive-in, the atomic force probe is operated in the contact mode at a force of at least about 10$^{-9}$ Newtons. The scanning time of the atomic force probe over a useful field of typically 0.5 $\mu$m×0.5 $\mu$m of the semiconductor substrate in the x-y direction is about 10 to about 1000 seconds for 512 lines (1 line is 0.5 $\mu$m). This scan rate of about 0.5 Hz to about 50 Hz is easily achievable and is known in the art. (See, for example, F. Kaufman and Y. Martin, IBM Technical Disclosure Bulletin Vol. 35 No. 4A, September 1992.) A scanning time over this field of about 60 to about 120 seconds (i.e. about 4 Hz to about 8 Hz) is more highly preferred to ensure 1 nm lateral control of the scanning probe.

In order to tailor a meaningful subset of MOSFET devices on a chip (i.e. from a minimum of 10 devices to a maximum of about 1000 devices), the total scan time per chip should be kept to less than 10,000 seconds and preferably to less than 1000 seconds. Furthermore, implementation of a multiple-tip atomic force probe, with one dedicated tip per chip in synchronous scan, ensures that one wafer can be processed in 1000 seconds.

FIGS. 4(a)–(c) show an embodiment of the present invention wherein multiple tips are employed. Specifically, FIG. 4(a) illustrates a wafer 70 having multiple chip sites 72 which are to be individually accessed by the Atomic Force Microscope (AFM) platten shown in FIG. 4(b). From 10 to 1000 devices per chip can be tailored according to the present invention in parallel.

FIG. 4(b) shows the AFM platten assembly 74 that may be used in the present invention (viewed from the bottom of the platten). The assembly includes multiple AFM tips/cantilevers 76, one for each chip site, aligned to the chip sites, which will be scanned in parallel over the identical chip sites for dopant tailoring via the present invention. Also shown are holes 78 etched completely through the platten for laser diode detection access. Motion in the x-y plane is controlled via bonded silicon or silicon oxide bars 80 attached directly or indirectly to the x-y piezo sensors. The platten is controlled by the same x-y scan mechanism as an isolated AFM base plate as is well-known in the art. The platten is a silicon wafer on which the array of tip-cantilevers are fabricated simultaneously, as is well known in the art. The holes for laser access are easily formed via wet-etch techniques which are also well known in the art.

FIG. 4(c) is a cross-sectional view of a platten/tip/cantilever assembly aligned over the silicon wafer containing the chips to be processed.

After the contacting and drive-in step discussed above, the dopant/bandgap source material layer is removed using conventional etching techniques which are well-known to those skilled in the art. This includes dry-etching techniques such as reactive-ion etching (RIE) and plasma etching as well as a wet chemical etch process. When a wet etch process is employed, hot-phosphoric acid, or the like etchants, which have a high-selectivity for the dopant/bandgap source material layer compared to the underlying semiconductor substrate are employed.

After removing the dopant/bandgap source material layer, the impurity region 22 provided by the above method is then activated using conventional annealing processing that are well known to those skilled in the art. Generally, the annealing conditions are capable of diffusing the impurity atoms further into the semiconductor substrate. However, it is an object of the present invention to minimize the out-diffusion of the impurities incorporated by means of "tapping" as disclosed above. Therefore, a small time-temperature budget is preferred in the two major cases of interest for MOSFET fabrication as follows:

1) In the case where the doped regions are intended for use as source-drain regions or as lightly-doped drain regions, as are well established in the art, the dopants can be annealed in an inert gas atmosphere, e.g. He, Ar, or $N_2$, which may optionally contain a minor amount of oxygen (<10% oxygen). The activation of the dopant can be carried out at a temperature in the range of about 900° C. to about 1100° C. for a time period of about 5 to about 60 seconds. More preferably, the annealing process is carried out at a temperature in the narrow range of about 980° C. to about 1000° C. for a time period of about 2 to 15 seconds.

2) In the case where the doped regions are designed to be MOSFET channel doping regions, as is well established in the art, generally the dopant activation occurs during the subsequent growth of the gate oxide. The annealing temperature is the growth temperature in this case, and temperatures are preferably low in comparison to case 1 above and are in the range of 700° C. to 850° C. The annealing/growth time is dictated by the thickness of gate oxide desired. Current art requires no more than 2.0 to 4.0 nm of gate oxide. The time period of growth for such a thickness at 700° C. to 850° C., is typically in the range 10 to 30 minutes, depending on the ambient growth gas (typically $O_2$ or $H_2O$ or a mixture of $O_2$ and $H_2O$ and $N_2O$), as is well known in the art. For the current invention, the thinnest possible oxide is preferred, i.e. about 2.0 to 2.5 nm, so that less than 50% of the dopant incorporated into the semiconductor substrate by the method disclosed herein, (typically to a depth of 2.0 to 3.0 nm) is consumed or segregated into the growing oxide.

If further MOSFET processing is required, the necessary regions of the device can be formed by using processing techniques well known in the art. For example, if a gate oxide has been formed, e.g. as described in case 2 immediately above, the next step is the formation of the gate conductor, typically using deposited, doped polysilicon. The gate film is patterned using standard lithography and RIE etching. Sidewall oxide spacers can then be formed on the vertical sidewalls of the patterned gate oxide-polysilicon stack. One such device is shown in FIG. 5. In this figure, the structure includes the semiconductor substrate 10, diffusion regions 22, spot-weld region 22S, thermally-grown gate oxide 102, sidewall oxide spacer regions 104, and polysilicon gate region 100. The spot-weld region 22S is formed using the technique described in the present invention.

FIG. 6 is a graph of the drain current vs. gate voltage at Vd=0.05 V for various channel dopant levels, which levels have been "tuned" via the technique described herein. Specifically, FIG. 6 demonstrates how various levels of "spotwelding" of n (Arsenic) or p (Boron) dopants in the channel of a standard MOS NFET alter the drain-to-source current (Ids) characteristic with respect to applied DC voltage of the gate (relative to the source) (Vgs). The channel length, L, of this device is assumed to be 0.5 $\mu$m, being the distance laterally from the left $n^+$ (source) contact to the right $n^+$ (drain) contact. In this case, the spotweld is confined to a lateral region (in the x-direction) which spans 50 nm (0.05 $\mu$m) in the channel of the NFET. The voltage from drain to source is held fixed at 0.05 V in this case. Case (a) is the standard NFET fabricated via conventional processing. Cases (c), (d), and (f) show how the Ids characteristic shifts upward at low voltages for increasing values of the n-type spotweld dopant concentration. Ids at higher Vgs is virtually unaffected. Case (b) shows the shift downward of Ids at low voltages; again, Ids at higher voltage is virtually unaffected. By contrast, case (e) shows the effect of the addition of an extra uniform concentration of boron by conventional means. [Note, (e) is added at 5 times less local concentration than the case (b) spotweld.] Clearly, a uniform addition of dopant (p or n type) results in a uniform downward shift, at a given Vgs, in current in the Ids vs. Vgs characteristic of the device. Thus a spotweld of dopant can be used to tailor the turn on characteristics of a FET device with little impact to the performance of the device. This is not the case for conventional doping techniques, which cannot be localized on the scale disclosed by the present invention.

The contacting step of the present invention results in a controllable diffusion region(s) which has a lateral dimension of from about 10 to about 100 nm and a depth of from about 0.5 to about 3 nm. Moreover, the above processing technique is capable of providing a diffusion region(s) of high resolution which has a dopant concentration of greater than $10^{16}$ atoms/cm$^3$, but less than $10^{19}$ atoms/cm$^3$. It is further noted that the method of the present invention is capable of providing dopant atoms that are arrayed in regular patterns via precision tip control that can be obtained in the present invention. Thus, the present method can be used in fabricating a quantum dot or quantum wires which are highly suitable for small electronic devices. It is emphasized that no masking step is required for incorporation of the dopants via the AFM technique described in the present invention.

Figure 7B:
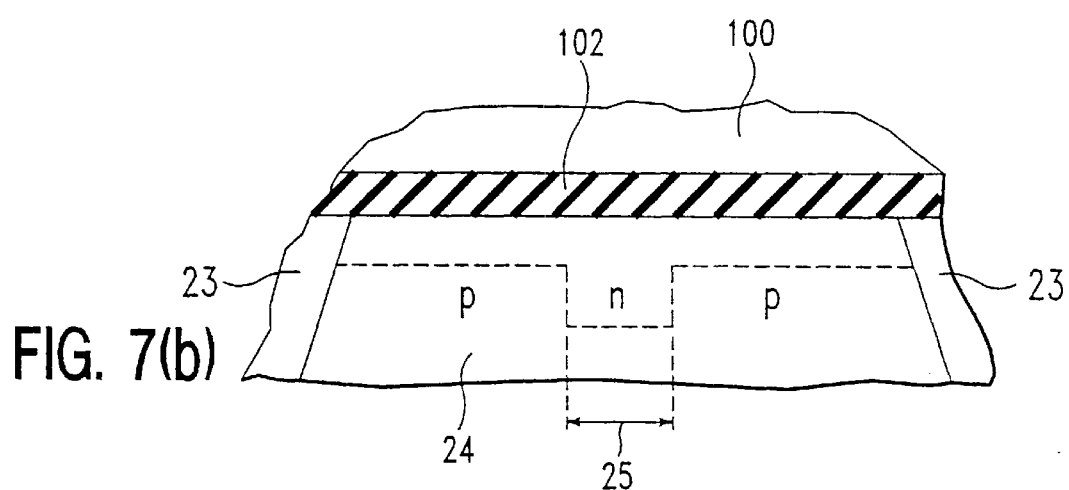

FIGS. 7(a)–(b) illustrate a heterojunction semiconductor structure which can be prepared using the above described AFM method. Specifically, the heterojunction structure of FIG. 7(a) comprises a semiconductor substrate 10, doped contact regions 23 which can be formed by conventional methods, i.e. ion implantation, or the method of the present invention, and a lateral, tapped-in p-n-p region 24 which is formed using the present method. The inset to the figure (FIG. 7(b)) shows the channel region containing the tapped-in p-n-p region in a detail blown-up portion. In this figure, 25 represents the width of the tapped-in region. The boundaries of p-n-p junctions are made distinct. It is noted that region 24 could also be an n-p-n region. On top of region 24 is a FET device which comprises thermally-grown gate oxide 102, polysilicon gate region 100 and sidewall oxide spacers 104. The p-n-p heterojunction creates two built in potential barriers which act to modulate the drain-to-source current, Ids. Oscillations in the Ids current characteristics as a function of externally applied gate bias will result. These oscillations can used to advantage by one skilled in the art of circuit design.

FIG. 8 shows a cross-sectional view of another heterojunction semiconductor structure of the present invention. Specifically, the heterojunction structure comprises semiconductor substrate 10, doped contact regions 23, and a lateral tapped-in bandgap region 26 formed in the substrate in the channel of a would be FET-like device, as now further described. On top of the bandgap/channel region is shown the remaining FET-like structure (as in FIG. 5, including gate oxide, gate polysilicon, and oxide spacers). The channel length is again, L. But the bandgap region, which is of width, w (which is less than L), contains a modified conduction band level, Ec, and a modified valence band level, Ev, achieved by the method of the present invention. The Fermi level, Ef, which defines the number of carriers present in the channel region, is essentially unaffected by the presence of the bandgap region. It is clear that the Fermi level is closer to the resulting bands, Ec and Ev, in the bandgap region. Thus the bandgap region forms a quantum well in which carriers are preferentially localized relative to the rest of the channel. The degree of localization depends on the relative voltage biasses externally applied at the contacts and on the gate.

FIG. 9 is a plot of the electrical characteristic, Ids vs. Vgs, for the structure shown in FIG. 8. Here the substrate is silicon. The source/drain and gate contacts are $n^+$ doped. The channel length, L, defined in FIG. 8 is 0.1 $\mu$m, i.e. much smaller than the channel region of the FET described in the context of the dopant spotweld above (see FIG. 6). The bandgap region was formed by tapping in Ge from an overlayer of germanium oxide, which was stripped using deionized water before forming the gate oxide, gate contact and $n^+$ regions. The resulting SiGe quantum well width, w, is 30 nm, i.e. 30% of the channel length. The well is centered in the channel. In this case the source-to-drain voltage, Vds, is fixed at 1.4 V, while the gate voltage, Vgs, is ramped from 0 to 1.4 V. The curve labelled "a" represents the current characteristic similar to that shown in FIG. 6 for a standard FET, that is, for a device into which no Ge has been tapped. Therefore, there is no quantum well. [However, the channel length for the device characteristic of FIG. 6 was assumed to be 0.5 $\mu$m. For the present case, L is much smaller.] Curve b shows how the device characteristic is substantially modified by the presence of the 30 nm SiGe quantum well. In particular, quantum current oscillations in voltage develop even at room temperature. [Some current is lost due to carrier confinement in the well.] Curve c shows how the oscillation amplitude can be increased if the carrier effective mass in the SiGe quantum well is matched so as to be equal to the effective mass in the remaining channel. [This can be accomplished by applying a mechanical strain in the channel parallel to the current flow.] The presence of the quantum current oscillations can be used to advantage by one skilled in the art of circuit design. For example, the device described here could be used as an IF (interfrequency) modulation stage in the field of electronic communications.

While the present invention has been shown and described with respect to preferred embodiments thereof, it will be understood by those skilled in the art that the foregoing and other changes in form and detail may be made without departing from the spirit and scope of the present invention.

What is claimed is:

1. A heterojunction semiconductor structure comprising a semiconductor substrate having at least two doped contact regions formed therein, each of said doped contact regions separating internal active device regions from each other, said internal active device regions comprise tapped-in dopant or bandgap regions which are present laterally in the semiconductor substrate, said tapped-in dopant or bandgap regions have an impurity concentration greater than $10^{16}$ atoms/cm$^3$, but less than $10^{19}$ atoms/cm$^3$ and a depth from about 1 to 3 monolayers; and external active device regions formed on said semiconductor substrate above said internal active device region.

2. The heterjunction semiconductor structure of claim 1 wherein said two doped contact regions are source/drain regions or emitter/collector regions.

3. The heterjunction semiconductor structure of claim 1 wherein said external active device regions are FET regions.

4. The heterjunction semiconductor structure of claim 3 wherein said FET regions comprise a gate oxide polysilicon stack and sidewall oxide spacers.

5. The heterjunction semiconductor structure of claim 1 wherein said semiconductor substrate is a semiconductor material selected from the group consisting of Si, Ge, SiGe, GaAs, InAs, InP and other III/V compound semiconductors.

6. The heterjunction semiconductor structure of claim 5 wherein said semiconductor substrate is Si.

7. The heterjunction semiconductor structure of claim 1 wherein said tapped-in dopant regions comprise alternation p-n-p or n-p-n regions.

8. The heterjunction semiconductor structure of claim 1 wherein said tapped-in bandgap regions comprise a valence band level, a Fermi level and a conductive band level, wherein some sections of said band level are closer to the Fermi level than others and wherein the latter region forms a lateral quantum well.

* * * * *